(12) United States Patent
Shin et al.

(10) Patent No.: US 11,644,915 B2
(45) Date of Patent: May 9, 2023

(54) DISPLAY PANEL AND DISPLAY DEVICE

(71) Applicant: LG DISPLAY CO., LTD., Seoul (KR)

(72) Inventors: Jungcheol Shin, Paju-si (KR); GiSang Hong, Paju-si (KR); KyoungJin Nam, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/518,155

(22) Filed: Nov. 3, 2021

(65) Prior Publication Data
US 2022/0206612 A1 Jun. 30, 2022

(30) Foreign Application Priority Data
Dec. 30, 2020 (KR) .................. 10-2020-0187180

(51) Int. Cl.
*G06F 3/044* (2006.01)
*G06F 3/041* (2006.01)
*H01L 27/32* (2006.01)
*H01L 51/52* (2006.01)

(52) U.S. Cl.
CPC .......... *G06F 3/0412* (2013.01); *H01L 27/322* (2013.01); *H01L 27/323* (2013.01); *H01L 27/3244* (2013.01); *H01L 51/5253* (2013.01); *G06F 3/044* (2013.01)

(58) Field of Classification Search
CPC ...... G06F 3/0412; G06F 3/0446; G06F 3/044; G06F 2203/04112
See application file for complete search history.

(56) References Cited

U.S. PATENT DOCUMENTS

| | | | | |
|---|---|---|---|---|
| 7,056,455 B2 * | 6/2006 | Matyjaszewski | ..... | C04B 35/524 521/61 |
| 7,347,953 B2 * | 3/2008 | Black | .................. | B81C 1/00031 430/315 |
| 8,486,613 B2 * | 7/2013 | Kim | ..................... | B81C 1/00031 430/324 |
| 8,632,700 B2 * | 1/2014 | Winoto | ................. | C09D 11/322 252/514 |
| 8,815,126 B2 * | 8/2014 | Winoto | .................. | H05K 3/125 252/514 |
| 9,262,030 B2 * | 2/2016 | Aoki | ......................... | G06F 3/047 |
| 9,830,031 B2 * | 11/2017 | Kim | ...................... | G06F 3/0443 |
| 9,857,901 B2 * | 1/2018 | Yoon | .................... | H01L 51/5281 |
| 2009/0283304 A1 * | 11/2009 | Winoto | .................. | H05K 1/097 977/773 |
| 2010/0151393 A1 * | 6/2010 | Kim | ..................... | B81C 1/00031 430/322 |
| 2014/0299365 A1 * | 10/2014 | Sebastian | .............. | G06F 3/0445 216/13 |
| 2015/0130726 A1 * | 5/2015 | Min | ..................... | G06F 3/04164 345/173 |
| 2016/0216827 A1 * | 7/2016 | Lee | ......................... | G06F 3/0443 |
| 2016/0224170 A1 * | 8/2016 | Kim | ....................... | G06F 3/0443 |

(Continued)

*Primary Examiner* — Olga V Merkoulova
(74) *Attorney, Agent, or Firm* — Birch, Stewart, Kolasch & Birch, LLP

(57) ABSTRACT

A display panel and a display device are provided in which a nanostructure are provided. The nanostructure, a first conversion portion and a third conversion portion of a color filter are positioned to overlap each other in a non-light emitting region, thereby reducing external light reflection and being capable of omitting a black matrix patterning process due to the absence of a black matrix.

13 Claims, 34 Drawing Sheets

(56) References Cited

U.S. PATENT DOCUMENTS

2016/0299610 A1* 10/2016 Yoon .................. H01L 51/5281
2020/0119113 A1*  4/2020 Lee ...................... G06F 3/0446
2020/0194728 A1   6/2020 Kim et al.

* cited by examiner

DISPLAY PANEL AND DISPLAY DEVICE

CROSS REFERENCE TO RELATED APPLICATION

This application claims priority to Korean Patent Application No. 10-2020-0187180, filed in the Republic of Korea on Dec. 30, 2020, the entire contents of which are hereby expressly incorporated by reference for all purposes as if fully set forth herein into the present application.

BACKGROUND

Technical Field

The present disclosure relates to a display panel and a display device.

Discussion of the Background Art

The growth of the information society leads to increased demand for various types of display devices. In recent years, various display devices such as a liquid crystal display device, a plasma display device and an organic light emitting display device are utilized.

Among these display devices, there is a touch display device that provides a touch-based input method in order for a user to easily and intuitively and conveniently input information or a command instead of a conventional input method such as a button, a keyboard, or a mouse. The touch display device can include a touch electrode for sensing a touch input in order to provide a touch-based input method.

The touch display device can provide an excellent display quality while providing a touch-based input method. However, in the display quality of the touch display device, there can be a limitation that visibility may be deteriorated due to the reflection of external light. In the touch display device, the reflection of external light can occur, for example, in a touch electrode for sensing a touch input.

In order to reduce the reflection of external light, the display device can include a polarizing plate. However, in the case that a polarizing plate is used in a display device, the polarizing plate can be expensive, and there can be a limitation in that product design may be limited due to the arrangement of the polarizing plate.

SUMMARY OF THE DISCLOSURE

Embodiments of the present disclosure provides a display panel and a display device capable of reducing a reflection of external light.

Embodiments of the present disclosure can provide a display panel and a display device capable of reducing a reflection of external light even without a polarizing plate.

In one aspect, embodiments of the present disclosure can provide a display panel including a substrate, an encapsulation layer disposed on the substrate, a touch electrode disposed on the encapsulation layer, a nanostructure disposed on the touch electrode, a first insulating layer disposed on the nanostructure, and a color filter disposed on the first insulating layer.

A first subpixel, a second subpixel and a third subpixel are defined in the substrate. The first subpixel includes a first light emitting region configured to emit light having a first color, the second subpixel includes a second light emitting region configured to emit light having a second color, and a third subpixel includes a third light emitting region configured to emit light having a third color.

The substrate includes a non-light emitting region positioned around the first light emitting region, the second light emitting region and the third light emitting region.

The touch electrode can include a first metal layer. The nanostructure can be in direct contact with the first metal layer.

The color filter can include a first conversion portion disposed on the first insulating layer and corresponding to the first subpixel, a second conversion portion disposed on the first insulating layer and corresponding to the second subpixel, and a third conversion portion disposed on the first insulating layer and corresponding to the third subpixel, The nanostructure, the first conversion portion and the third conversion portion can be positioned to overlap each other in the non-light emitting region.

The touch electrode can further include a second metal layer. The second metal layer can include a different metal from the first metal layer, and the first metal layer can be disposed on the second metal layer.

The touch electrode can further include a third metal layer. The third metal layer can include a different metal from the first metal layer, and the second metal layer can be disposed on the third metal layer.

The first metal layer and the third metal layer can include the same metal.

The nanostructure can include a conical pattern layer in direct contact with the first metal layer and a semi-circular pattern layer disposed on the conical pattern layer.

The semi-circular pattern layer can be made of a material different from that of the conical pattern layer.

The conical pattern layer can be made of a material different from that of the first metal layer. The conical pattern layer can be an inorganic insulator.

The conical pattern layer can be composed of an inorganic insulator, and the semi-circular pattern layer can be composed of a metal oxide, and the semi-circular pattern layer can be in direct contact with the conical pattern layer.

The first metal layer and the conical pattern layer can be made of the same material as each other, and the semi-circular pattern layer can be in direct contact with the conical pattern layer.

The nanostructure can include a plurality of irregularities irregularly formed. The plurality of irregularities irregularly formed can be inorganic insulators.

In another aspect, embodiments of the present disclosure can provide a display device including a display panel, and a control unit for controlling the display panel.

According to embodiments of the present disclosure, it is possible to provide display panel and a display device capable of reducing the external light reflection.

According to embodiments of the present disclosure, it is possible to provide a display panel and a display device in which a nanostructure are provided and the nanostructure, the first conversion portion and the third conversion portion of the color filter are positioned to overlap each other in the non-light emitting region, thereby reducing external light reflection.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
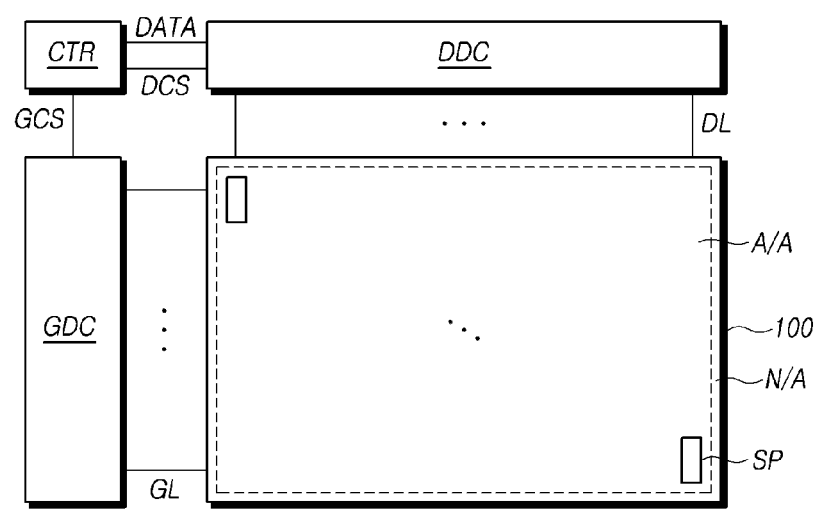
FIGS. 1 and 2 schematically illustrate a display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another.

Further, in the following description of examples or embodiments of the present disclosure, detailed descriptions of well-known functions and components incorporated herein will be omitted when it is determined that the description can make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

FIG. 1 is a structural diagram illustrating a display device according to an embodiment of the present disclosure. All the components of each display device according to all embodiments of the present disclosure are operatively coupled and configured.

Referring to FIG. 1, a display device 10 according to the embodiments of the present disclosure can include a display panel 100 including an active area A/A and a non-active area N/A, and a gate driving circuit GDC, a data driving circuit DDC, and a controller CTR as a control unit. The controller CTR can include one or more processors, micro-processors, integrated circuits, etc.

In the display panel 100, a plurality of gate lines GL and a plurality of data lines DL crossing the gate lines GL are disposed, and a subpixel SP can be disposed in a region where the gate line GL and the data line DL intersect. In addition, the display panel 100 can be a liquid crystal panel. The liquid crystal panel can include a pixel electrode, a common electrode, and a liquid crystal layer disposed between the pixel electrode and the common electrode. The liquid crystal layer can display an image by blocking or transmitting light by deforming the molecular arrangement in response to a voltage applied to the pixel electrode and the common electrode.

The gate driving circuit GDC is controlled by the controller CTR, and can sequentially output a scan signal to a plurality of gate lines GL disposed on the display panel 100 so as to control the driving timing of the plurality of subpixels SP.

The data driving circuit DDC can receive image data from the controller CTR and convert the image data into an analog data voltage. The data driving circuit DDC outputs a data voltage to each data line DL according to a timing of applying of a scan signal through the gate line GL, so that each subpixel SP can express brightness according to image data.

The controller CTR can supply various control signals to the gate driving circuit GDC and the data driving circuit DDC, and can control the operations of the gate driving circuit GDC and the data driving circuit DDC.

The display device 10 can further include a power management integrated circuit for supplying various voltages or currents to the display panel 100, a gate driving circuit (GDC), a data driving circuit (DDC), or the like, or controlling various voltages or currents to be supplied.

The display device 10 according to the present embodiments can be an organic light emitting display device, a liquid crystal display device, a plasma display device, or the like.

In the case that the display device 10 according to the present embodiments is an organic light emitting display device, each subpixel SP arranged on the display panel 100 can include circuit elements such as an organic light emitting diode (OLED) as a self-luminous element, and a driving transistor for driving the organic light emitting diode.

The type and number of circuit elements constituting each subpixel SP can be variously determined according to a provided function and a design method.

Figure 2:
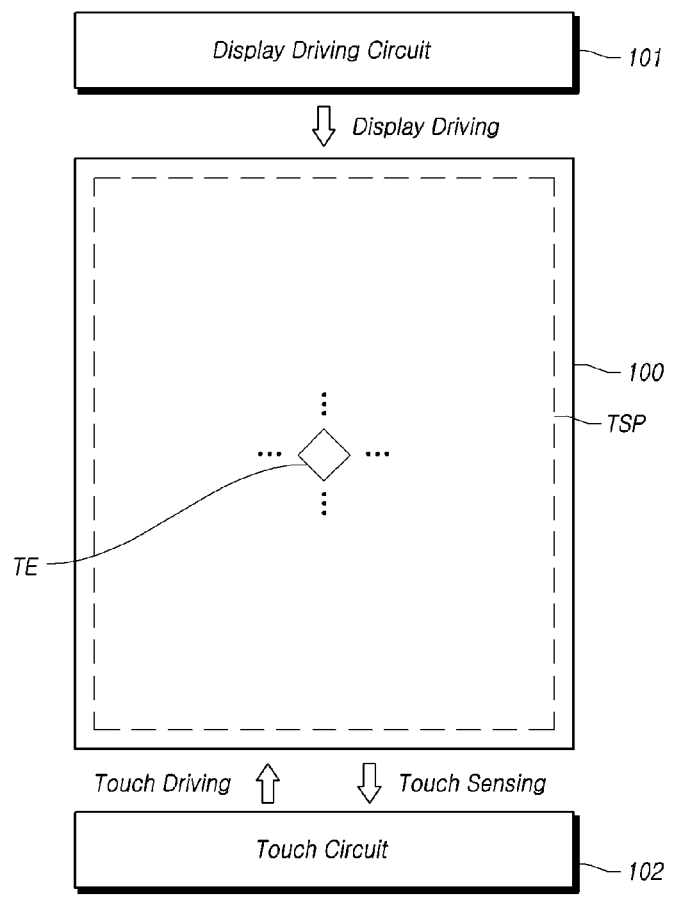

FIG. 2 schematically illustrates a display device according to embodiments of the present disclosure.

Referring to FIG. 2, the display device 10 according to embodiments can provide an image display function for displaying an image and a touch sensing function for sensing a user's touch.

The display device 10 according to the embodiments can include, for displaying the image, a display panel 100 on which data lines and gate lines are disposed, and a display driving circuit 101 for driving the display panel 100.

The display driving circuit 101 can functionally include a data driving circuit for driving the data lines, a gate driving circuit for driving the gate lines, and a controller for controlling the gate driving circuit and the data driving circuit.

The display driving circuit 101 can be implemented with one or more integrated circuits.

The display device 10 according to the embodiments can include, for touch sensing, a touch panel TSP on which a plurality of touch electrodes TE are disposed as a touch sensor and a plurality of touch lines TL electrically connected to all or part of the plurality of touch electrodes TE are disposed, and a touch circuit 102 for sensing the presence of a touch or a touch position by driving the touch panel TSP.

The touch circuit 102 can supply a touch driving signal to the touch panel TSP to drive the touch panel TSP, detect a touch sensing signal from the touch panel TSP, and sense whether there is a touch and/or the touch position (touch coordinates).

The touch circuit 102 can be implemented as one or more components (e.g., an integrated circuit), and can be implemented separately from the display driving circuit 101.

In addition, all or part of the touch circuit 102 can be implemented by being integrated with the display driving circuit 101 or an internal circuit thereof. For example, the touch driving circuit of the touch circuit 102 can be implemented as an integrated circuit together with the data driving circuit of the display driving circuit 101.

Meanwhile, the display device 10 according to embodiments can sense a touch based on capacitance formed in the touch electrodes TE.

In addition, the display panel 100 of the display device 10 according to the embodiments can be of various types such as an organic light emitting diode panel (OLED Panel), a liquid crystal display panel (LCD Panel), and the like.

Hereinafter, for convenience of description, it will be mainly described an organic light emitting diode panel (OLED Panel) as an example.

Figure 3:
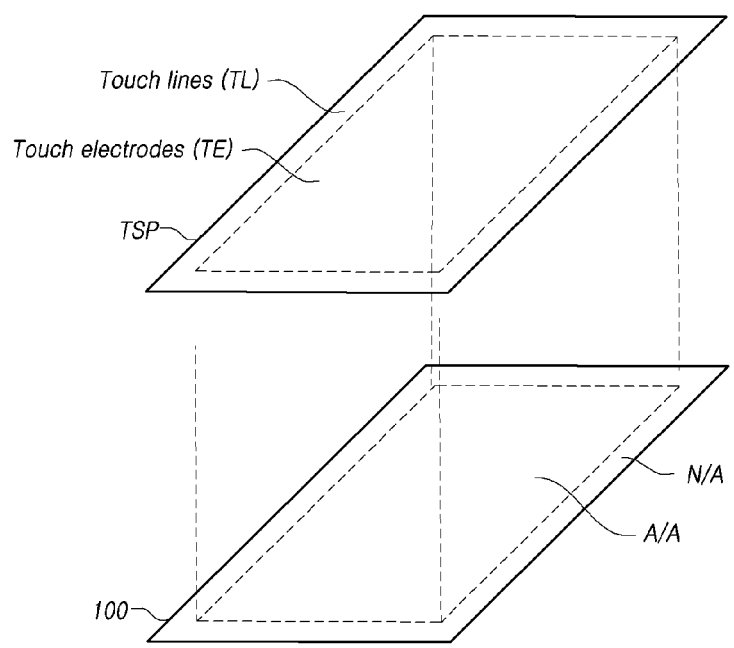
FIG. 3 illustrates a display panel and a touch panel of a display device according to embodiments of the present disclosure.

Referring to FIG. 3, the display panel 100 includes an active area A/A in which an image is displayed and a non-active area N/A that is an area outside the active area A/A. Here, the active area A/A is also referred to as a display area, and the non-active area N/A is also referred to as a non-display area.

The plurality of subpixels defined by data lines and gate lines can be arranged in the active area A/A.

In the non-active area A/A, there can be provided with lines and pads for connecting data lines, gate lines, and various signal lines in the active area A/A to the display driving circuit 101.

A plurality of touch electrodes TE and a plurality of touch lines TL can be disposed on the touch panel TSP.

The plurality of touch electrodes TE can be positioned to correspond to the active area A/A of the display panel 100.

A plurality of touch lines TL can be positioned to correspond to the non-active area N/A of the display panel 100.

For example, the plurality of touch lines TL can be disposed outside the touch electrode area (the active area A/A or the corresponding area) in which the plurality of touch electrodes TE are disposed.

The touch panel TSP can be built-in or external to the display panel 100.

As described above, the touch electrodes TE are disposed in the active area A/A of the display panel 100, and the touch lines TL are disposed in the non-active area N/A of the display panel 100, so that it is possible to provide touch sensing matched to the display state.

Figure 4:
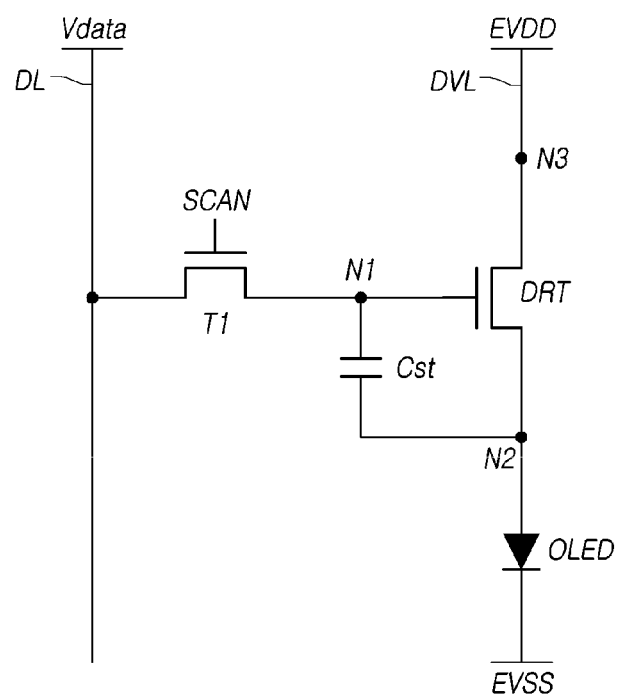
FIGS. 4 and 5 illustrate examples of subpixel structures of a display panel according to embodiments of the present disclosure.
Figure 5:
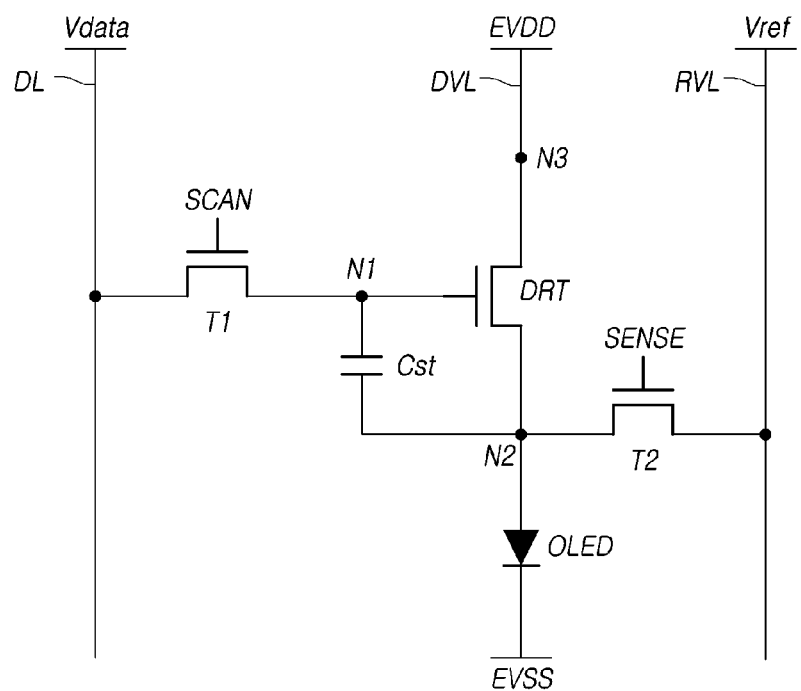

FIGS. 4 and 5 illustrate examples of subpixel structures of display devices according to embodiments.

More specifically, FIGS. 4 and 5 illustrate examples of subpixel structures in the case that a display panel of a display device according to embodiments is an organic light emitting display panel.

Referring to FIGS. 4 and 5, in the case that the display device 10 according to the embodiments is an organic light emitting display device, each subpixel basically includes an organic light emitting diode (OLED), a driving transistor DRT for driving the organic light emitting diode, a first transistor T1 for transferring the data voltage to a first node N1 corresponding to a gate node of the driving transistor DRT, and a storage capacitor Cst for maintaining the data voltage corresponding to the image signal voltage or a voltage corresponding thereto for one frame time.

The organic light emitting diode (OLED) can include a first electrode (e.g., an anode electrode or a cathode electrode), an organic layer, and a second electrode (e.g., a cathode electrode or an anode electrode). The organic layer includes one or more light emitting layers and can further include a hole injection layer, a hole transport layer, an electron transport layer, an electron injection layer, a charge generation layer, etc.

A ground voltage EVSS can be applied to the second electrode of the organic light emitting diode (OLED).

The driving transistor DRT can drive the organic light emitting diode by supplying a driving current to the organic light emitting diode.

The driving transistor DRT can include a first node N1, a second node N2 and a third node N3.

The first node N1 of the driving transistor DRT is a node corresponding to a gate node, and can be electrically connected to a source node or a drain node of the first transistor T1.

The second node N2 of the driving transistor DRT can be electrically connected to the first electrode of the organic light emitting diode OLED, and can be a source node or a drain node.

The third node N3 of the driving transistor DRT is a node for applying a driving voltage EVDD, and can be electrically connected to a driving voltage line DVL for supplying the driving voltage EVDD, and can be a drain node or a source node.

The first transistor T1 can be electrically connected between the data line DL and the first node N1 of the driving transistor DRT, and can be controlled by receiving a scan signal SCAN at the gate node through the gate line.

The first transistor T1 can be turned on by the scan signal SCAN to transmit the data voltage Vdata supplied from the data line DL to the first node N1 of the driving transistor DRT.

The storage capacitor Cst can be electrically connected between the first node N1 and the second node N2 of the driving transistor DRT.

The storage capacitor Cst is not a parasitic capacitor (e.g., Cgs, Cgd) which is an internal capacitor existing between the first node N1 and the second node N2 of the driving transistor DRT, but is an external capacitor intentionally designed outside the driving transistor DRT.

Meanwhile, for a voltage control of the second node N2 of the driving transistor DRT, or for sensing a characteristic value of a subpixel (e.g., a threshold voltage or mobility of the driving transistor DRT, a threshold voltage of an organic light emitting diode etc.), as shown in FIG. 5, each subpixel can further include a second transistor T2.

The second transistor T2 can be electrically connected between the second node N2 of the driving transistor DRT and a reference voltage line RVL supplying a reference voltage Vref, and can be controlled by receiving a sensing signal SENSE, which is a type of scan signal, at a gate node.

The second transistor T2 can be turned on by the sensing signal SENSE to apply the reference voltage Vref supplied through the reference voltage line RVL to the second node N2 of the driving transistor DRT.

Further, the second transistor T2 can be used as one of the voltage sensing paths for the second node N2 of the driving transistor DRT.

Meanwhile, the scan signal SCAN and the sensing signal SENSE can be separate gate signals. In this case, the scan signal SCAN and the sensing signal SENSE can be respectively applied to the gate node of the first transistor T1 and the gate node of the second transistor T2 through different gate lines.

In some cases, the scan signal SCAN and the sensing signal SENSE can be the same gate signal. In this case, the scan signal SCAN and the sensing signal SENSE can be commonly applied to the gate node of the first transistor T1 and the gate node of the second transistor T2 through the same gate line.

Each of the driving transistor DRT, the first transistor T1, and the second transistor T2 can be an n-type transistor or a p-type transistor.

Figure 6:
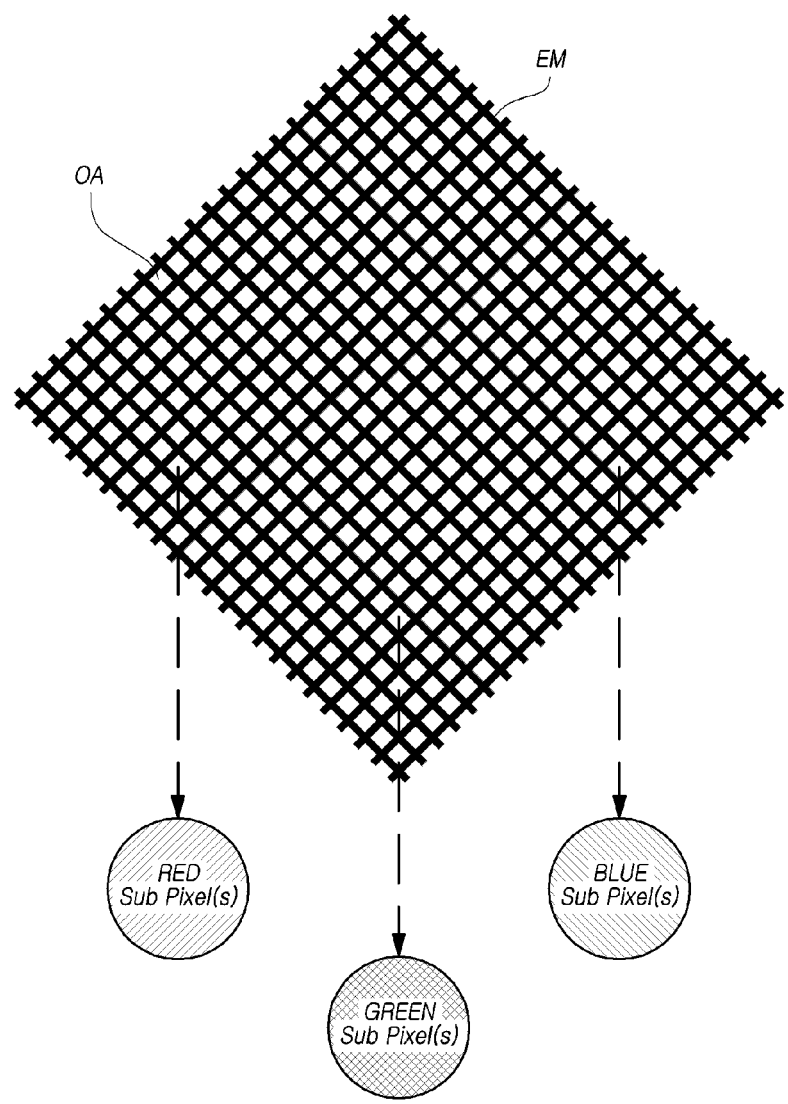
FIG. 6 illustrates a correspondence relationship between a region of a mesh-type touch electrode and a subpixel region of a display device according to embodiments of the present disclosure.

FIG. 6 illustrates a correspondence relationship between a region of a mesh-type touch electrode TE and a subpixel region in the display device 10 according to embodiments of the present disclosure.

Referring to FIG. 6, in the display device 10 according to the exemplary embodiment, each of the plurality of touch electrodes TE can be an electrode metal EM in which holes OA exist by being patterned in a mesh-type. Here, the hole OA also referred to as an open area.

In the touch electrode TE formed by patterning the electrode metal EM in a mesh-type, each of the holes OA can correspond to a light emitting region of one or more subpixels.

For example, in the case that the display panel 100 is an LCD panel, the light emitting region of the subpixel can include a pixel electrode or a color filter. In the case that the display panel 100 is an OLED panel, the light emitting region of the subpixel can include an anode electrode of an organic light emitting diode, an organic light emitting layer, and the like, and in some cases, a color filter, etc.

As described above, when viewed in a plan view, the electrode metal EM of the touch electrode TE is patterned in which the light emitting region of one or more subpixels corresponds to the position of each of the open areas OA existing in the area of the touch electrode TE, so that the luminous efficiency of the display panel 100 can be increased even when the electrode metal EM is made of an opaque material.

Figure 7:
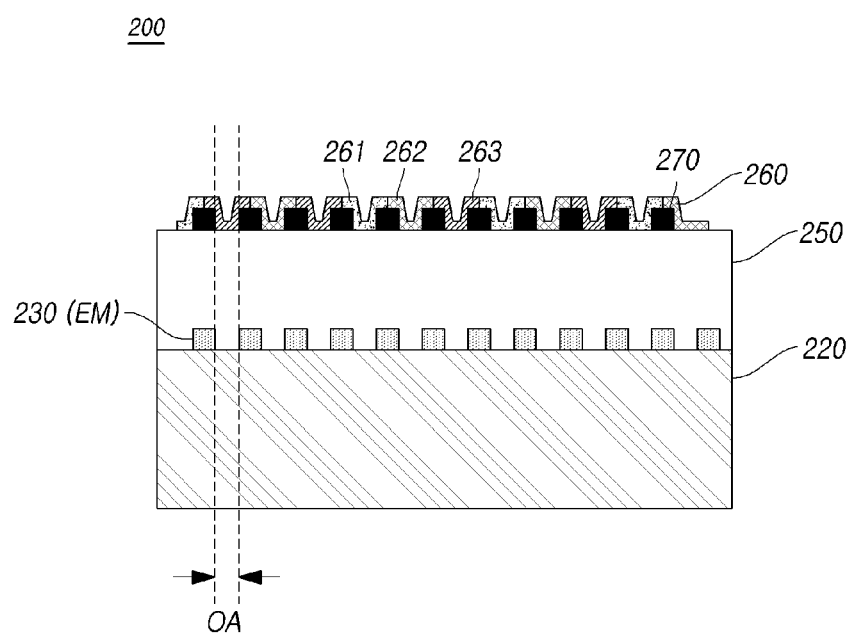
FIGS. 7 and 8 are schematic cross-sectional diagrams of a display panel according to a comparative example of the present disclosure.

FIG. 7 briefly illustrates a cross-section of a display panel according to a comparative example of the present disclosure.

Referring to FIG. 7, a display panel 200 can include an encapsulation layer 220, a touch electrode 230 positioned on the encapsulation layer 220, a first insulating layer 250 positioned on the touch electrode 230, a color filter 260 positioned on the first insulating layer 250, and a black matrix 270 positioned on the first insulating layer 250.

The touch electrode 230 can be a touch sensor metal such as the above-described touch electrode TE and touch line TL. The touch electrode 230 can include a hole OA corresponding to the light emitting region of the subpixel.

The color filter 260 can be positioned on the touch electrode 230, and can include a first conversion portion 261, a second conversion portion 262 and a third conversion portion 263. The first conversion portion 261 can be a filter for transmitting light having a first color, the second conversion portion 262 can be a filter that transmits light having a second color, and the third conversion portion 263 can be a filter that transmits light having a third color.

The black matrix 270 can be positioned between the first conversion portion 261, the second conversion portion 262 and the third conversion portion 263.

The black matrix 270 can be positioned to overlap the touch electrode 230.

In the present specification, that a component is positioned overlapping another component can preferably mean that another component is positioned vertically above or below the component on a vertical cross-section.

Since the black matrix 270 is positioned to overlap the touch electrode 230, even if the light outside the display panel 200 propagates to be reflected by the touch electrode 230, the black matrix 270 can block the external light so as to reduce the external light reflection.

Figure 8:
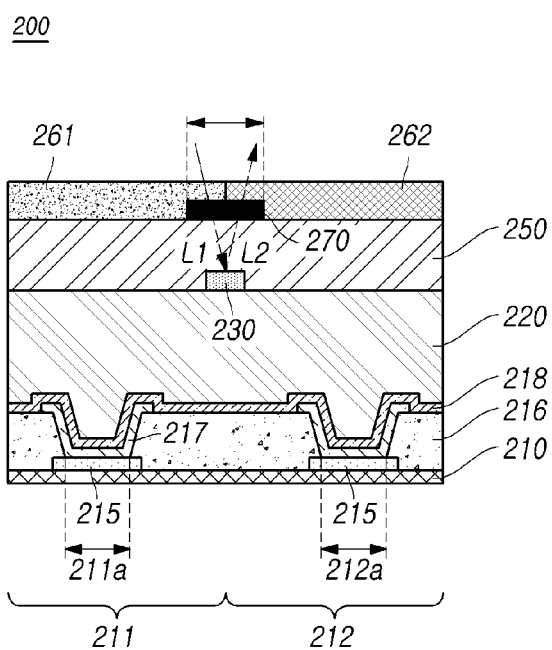

FIG. 8 is a cross-sectional diagram a display panel according to a comparative example.

Referring to FIG. 8, the display panel 200 according to the comparative example can include a substrate 210, a first electrode 215 positioned on the substrate 210, a bank layer 216 positioned on the first electrode 215, an organic layer 217 positioned on the first electrode 215 and the bank layer 216, a second electrode 218 positioned on the organic layer 217 and the bank layer 216, an encapsulation layer 220 positioned on the second electrode 218, a touch electrode 230 positioned on the encapsulation layer 220, a first insulating layer 250 positioned on the touch electrode 230, a black matrix 270 positioned on the first insulating layer, and a color filter 260 positioned on the first insulating layer 250.

A first subpixel 211 including a first light emitting region 211a and a second subpixel 212 including a second light emitting region 212a can be defined on the substrate 210.

The black matrix 270 can be positioned to overlap the touch electrode 230, so that the external light L1 incident toward the touch electrode 230 can be blocked before reaching the touch electrode 230. Accordingly, the reflectance of the display panel 200 can be reduced by weakening the intensity of the light L2 reflected from the touch electrode 230.

Figure 9:
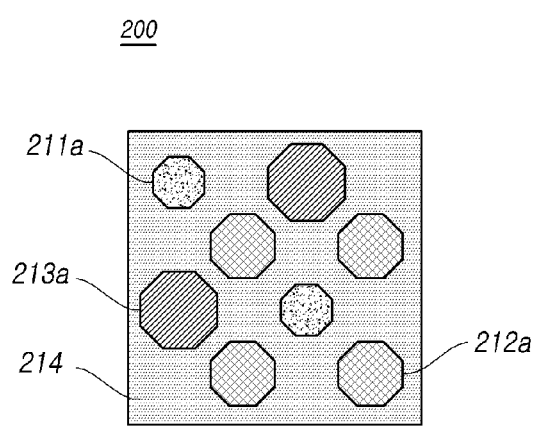
FIG. 9 is a schematic diagram illustrating a plane of a display device according to a comparative example of the present disclosure.

FIG. 9 illustrates a light emitting region and a non-light emitting region of the display panel 200 according to a comparative example of the present disclosure.

Referring to FIG. 9, the display panel 200 can include a first light emitting region 211a, a second light emitting region 212a, a third light emitting region 213a, and a non-light emitting region 214. Since the light emitting region is an area in which light generated from the organic layer is emitted, if the black matrix overlaps the light emitting region, there can be problem that the efficiency of the display panel 200 is reduced. Accordingly, the black matrix is required to be formed by a patterning process so as to overlap the non-light emitting region 214. However, since the patterning process is performed using a method such as photolithography requiring a lot of cost and time, the display panel 200 according to the comparative example has a problem in which it is required a separate patterning process for forming the black matrix 270.

Figure 10:
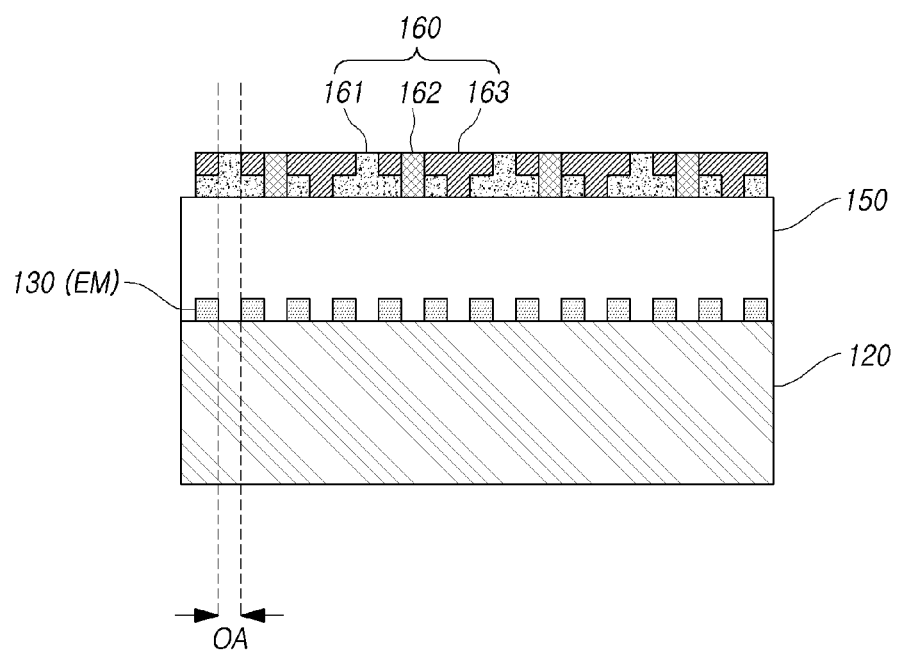
FIGS. 10 and 11 are schematic cross-sectional diagrams of a display device according to an exemplary embodiment of the present disclosure.

FIG. 10 is a schematic cross-sectional diagram of the display panel 100 according to an embodiment of the present disclosure.

Referring to FIG. 10, the display panel 100 can include an encapsulation layer 120, a touch electrode 130 positioned on the encapsulation layer 120, a first insulating layer 150 positioned on the touch electrode 130, and a color filter 160 positioned on the first insulating layer 150.

The encapsulation layer 120 is a layer for protecting circuit elements such as an organic light emitting diode (OLED) included in the display panel 100 from moisture and oxygen outside the display panel 100. The encapsulation layer 120 can be a single layer or a multi-layer, and can be one or more selected from an organic layer and an inorganic layer.

The first insulating layer 150 is a layer for planarizing the touch electrode 130. The first insulating layer 150 can be a single layer or a multi-layer, and can be at least one selected from an organic layer and an inorganic layer.

The color filter 160 can include a first conversion portion 161, a second conversion portion 162, and a third conversion portion 163. The first to third conversion portions can be optical filters that transmit light having a specific color and block light having the remaining color. For example, the first conversion portion 161 can transmit light having a first color and block light having a second color and a third color, and the second conversion portion 162 can transmit light having a second color and block the light having the first color and the third color, and the third conversion portion 163 can transmit the light having the third color and block the light having the first color and the second color.

The first conversion portion 161 and the third conversion portion 163 a can be positioned to overlap in a non-light emitting region 114. In a region where the first conversion portion 161 and the third conversion portion 163 overlap each other, the light blocked by the first conversion portion 161 and the light blocked by the third conversion portion 163 can be blocked. Accordingly, unlike the display panel 100 according to the comparative example, the display panel 100 can prevent external light from being reflected by the touch electrode 130 even if it does not include a black matrix, thereby reducing external light reflection.

Figure 11:
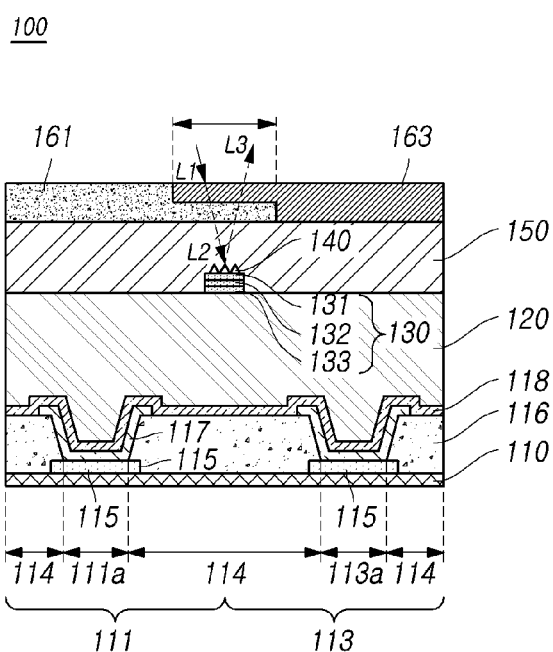

FIG. 11 is a cross-sectional diagram of a display panel 100 according to embodiments of the present disclosure.

Referring to FIG. 11, the display panel 100 according to embodiments of the present disclosure can include a substrate 110, an encapsulation layer 120 positioned on the substrate, a touch electrode 130 positioned on the encapsulation layer, a nanostructure 140 positioned on the touch electrode, a first insulating layer 150 positioned on the nanostructure, and a color filter 160 positioned on the first insulating layer 150.

The display panel 100 can include a substrate 110, a first electrode 115 positioned on the substrate 110, a bank layer 116 positioned on the first electrode 115, an organic layer 117 positioned on the first electrode 115 and the bank layer 116, a second electrode 118 positioned on the organic layer 117, an encapsulation layer 120 positioned on the second electrode 118 a touch electrode 130 positioned on the encapsulation layer 120, a nanostructure 140 positioned on the touch electrode 130, a first insulating layer 150 positioned on the nanostructure 140, and a color filter 160 positioned on the first insulating layer 150.

A first subpixel 111, a second subpixel, and a third sub-pixel 113 are defined on the substrate 110. The first subpixel 111 includes a first light emitting region 111a for emitting light having a first color, and the second subpixel includes a second light emitting region for emitting light having a second color, and the third sub-pixel 113 includes a third light emitting region 113a emitting light having a third color.

The substrate 110 includes a first light emitting region 111a, a second light emitting region, and a non-light emitting region 114 positioned around the third light emitting region 113a.

The touch electrode 130 can include a first metal layer 131. The type of the first metal layer 131 is not particularly limited, but can include, for example, one or more selected from titanium (Ti), molybdenum (Mo), aluminum (Al), and copper (Cu).

The touch electrode can include a second metal layer 132. The second metal layer 132 can include a metal different from that of the first metal layer 131, and the first metal layer 131 can be positioned on the second metal layer 132.

The type of the second metal layer 132 is not particularly limited, but includes, for example, one or more selected from titanium (Ti), molybdenum (Mo), aluminum (Al), and copper (Cu).

The touch electrode can include a third metal layer 133. The third metal layer 133 can include a different metal from the first metal layer 131, and the second metal layer 132 can be positioned on the third metal layer 133.

The type of the third metal layer 133 is not particularly limited, but can include, for example, one or more selected from titanium (Ti), molybdenum (Mo), aluminum (Al), and copper (Cu).

The first metal layer 131 and the third metal layer 133 can include the same metal.

The touch electrode 130 can have a structure of the first metal layer 131/the second metal layer 132/the third metal layer 133 from the top. FIG. 11 illustrates the touch electrode 130 having such a structure, however, the touch electrode 130 of the display panel according to embodiments of the present disclosure is not limited thereto.

The touch electrode 130 includes the first metal layer 131, the second metal layer 132, and the third metal layer 133. The first metal layer 131 can be Ti, and the second metal layer 132 can be Al, and the third metal layer 133 can be Ti.

The nanostructure 140 can be in direct contact with the first metal layer 131.

The shape and size of the nanostructure 140 is not particularly limited as long as it has a shape capable of exhibiting haze characteristics with respect to external light reaching the nanostructure 140. Since the nanostructure 140 includes a structure capable of implementing haze, it is possible to prevent light reaching the touch electrode 130 from being reflected.

The color filter 160 is positioned on the first insulating layer 150 and can include a first conversion portion 161 corresponding to the first subpixel 111, a second conversion portion positioned on the first insulating layer 150 and corresponding to the second subpixels, and a third conversion portion 163 positioned on the first insulating layer 150 and corresponding to the third subpixel 113.

The nanostructure 140, the first conversion portion 161, and the third conversion portion 163 can be positioned to overlap in the non-light emitting region 114. Since the nanostructure 140, the first conversion portion 161 and the third conversion portion 163 overlap each other in the non-light emitting region 114, it is possible to remarkably reduce external light reflection.

The strength of the light L1 incident toward the touch electrode 130 positioned in the non-light emitting region 114 is weaken while passing through the first conversion portion 161 and the third conversion portion 163 positioned to overlap in the non-light emitting region 114. The light L2 whose intensity is weakened by passing through the first conversion portion 161 and the third conversion portion 163 can reach the nanostructure 140 positioned on the touch electrode 130. Since the nanostructure 140 includes a structure capable of implementing haze, the intensity of the light L2 can be very weak or can be blocked after reaching the nanostructure 140. Accordingly, the intensity of the light L3 reflected to the outside is very weak by the first conversion portion 161, the third conversion portion 163 and the nanostructure 140, so that the display panel 100 can have a low reflectance with respect to external light.

According to the above-described structure, the display panel 100 can have a low external light reflectance even when the black matrix is not formed, unlike the comparative example, so that the process of forming the black matrix can be omitted, thereby reducing manufacturing cost and time.

Figure 12:
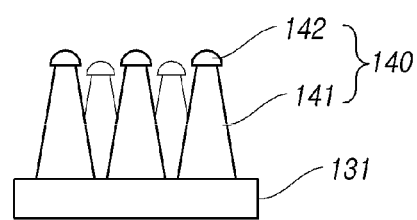
FIG. 12 illustrates a nanostructure of a display device according to an embodiment of the present disclosure.

FIG. 12 illustrates a nanostructure 140 according to embodiments of the present disclosure.

Referring to FIG. 12, the nanostructure 140 can include a conical pattern layer 141 in direct contact with the first metal layer 131 and a semi-circular pattern layer 142 positioned on the conical pattern layer 141.

The conical pattern layer 141 is a pattern layer having a substantially conical shape, and can have a shape in which an upper portion of a cone is cut.

The material of the conical pattern layer 141 is not particularly limited, but for example, can include one or more selected from titanium (Ti), molybdenum (Mo), aluminum (Al), copper (Cu), silicon oxide (SixOy), Silicon Nitride (SixNy), Silicon Oxynitride (SiNxOy), Indium Tin Oxide (ITO, Indium Tin Oxide), Indium Gallium Oxide (IGO, Indium Gallium Oxide), Indium Zinc Oxide (IZO, Indium Zinc Oxide) and Indium Gallium Zinc Oxide (IGZO, Indium Gallium Zinc Oxide).

The conical pattern layer 141 can have, for example, a height of 100 nm to 500 nm from a base in direct contact with the first metal layer 131 on a vertical cross-section.

The semi-circular pattern layer 142 is a pattern layer having a substantially semi-circular shape, is located on the conical pattern layer 141, and can have a convex side opposite to the conical pattern layer 141.

The material of the semi-circular pattern layer 142 is not particularly limited, but for example, can include one or more selected from titanium (Ti), molybdenum (Mo), aluminum (Al), copper (Cu), silicon oxide (SixOy), Silicon Nitride (SixNy), Silicon Oxynitride (SiNxOy), Indium Tin Oxide (ITO, Indium Tin Oxide), Indium Gallium Oxide (IGO, Indium Gallium Oxide), Indium Zinc Oxide (IZO, Indium Zinc Oxide) and Indium Gallium Zinc Oxide (IGZO, Indium Gallium Zinc Oxide).

The semi-circular pattern layer 142 can have, for example, a maximum height of 10 nm to 100 nm from a base in direct contact with the conical pattern layer 141 on a vertical cross-section.

In the case that the nanostructure 140 includes the conical pattern layer 141 and the semi-circular pattern layer 142 described above, the nanostructure 140 can be easily formed by a simple process.

The semi-circular pattern layer 142 can be made of a material different from that of the conical pattern layer 141. If the semi-circular pattern layer 142 and the conical pattern layer 141 are made of different materials, the nanostructure 140 can be easily formed by a simple process.

The conical pattern layer 141 can be made of a material different from that of the first metal layer 131. If the conical pattern layer 141 is made of a material different from that of the first metal layer 131, the nanostructure 140 can be easily formed by a simple process.

The conical pattern layer 141 can be an inorganic insulator. For example, the conical pattern layer can be made of silicon dioxide (SiO2).

The conical pattern layer 141 can be composed of an inorganic insulator, the semi-circular pattern layer 142 can be composed of a metal oxide, and the semi-circular pattern layer can be in direct contact with the conical pattern layer. For example, the conical pattern layer can be made of silicon dioxide (SiO2), and the semi-circular pattern layer can be made of indium tin oxide (ITO).

The first metal layer 131 and the conical pattern layer 141 can be made of the same material, and the semi-circular pattern layer 142 can directly contact the conical pattern layer 141. For example, the first metal layer 131 and the conical pattern layer 141 can be made of titanium (Ti), and the semi-circular pattern layer 142 can be made of indium tin oxide (ITO).

In embodiments other than that shown in FIG. 12, the nanostructure 140 can include a plurality of irregularities which are irregularly formed.

The plurality of irregularities can be an inorganic insulator. For example, the plurality of irregularities can be made of silicon dioxide (SiO2).

In the case that the nanostructure 140 has the same structure as described above, the nanostructure 140 can have haze characteristics with respect to the light reaching the nanostructure 140, so that the display panel can have low external light reflectance.

Figure 13:
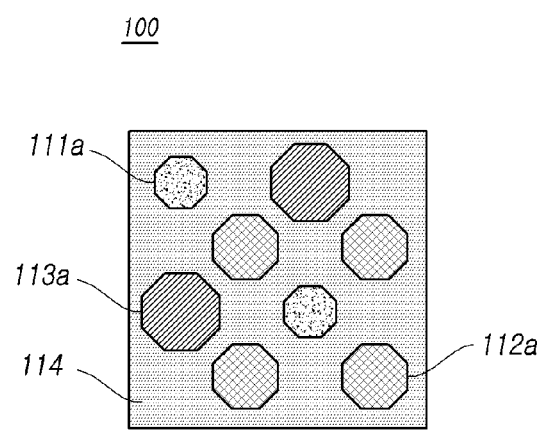
FIG. 13 is a schematic diagram illustrating a plane of a display device according to an exemplary embodiment of the present disclosure.

FIG. 13 is a plan view of a display panel according to embodiments of the present disclosure.

Referring to FIG. 13, the display panel 100 can include a first light emitting region 111a, a second light emitting region 112a, a third light emitting region 113a, and a non-light emitting region 114. The non-light emitting region 114 can be positioned around the first light emitting region 111a, the second light emitting region 112a, and the third light emitting region 113a.

In the first light emitting region 111a, only the first conversion portion among the conversion portions of the color filter can be located, in the second light emitting region 112a, only the second conversion portion among the conversion portions of the color filter can be located, and in the third light emitting region 113a, only a third conversion portion among the conversion portions of the color filter can be positioned. Accordingly, the display panel can emit light having a first color in the first subpixel, light having a second color in the second subpixel, and light having a third color in the third subpixel.

In all or a part of the non-light emitting region 114, the first conversion portion and the third conversion portion of the color filter can be positioned to overlap each other. Accordingly, since the first conversion portion and the third conversion portion can block external light from being incident on the touch electrode located in the non-light emitting region 114, the display panel can have a low external light reflectance.

FIGS. 14 to 19 are diagrams for explaining a method of manufacturing a display panel according to embodiments of the present disclosure.

Figure 14:
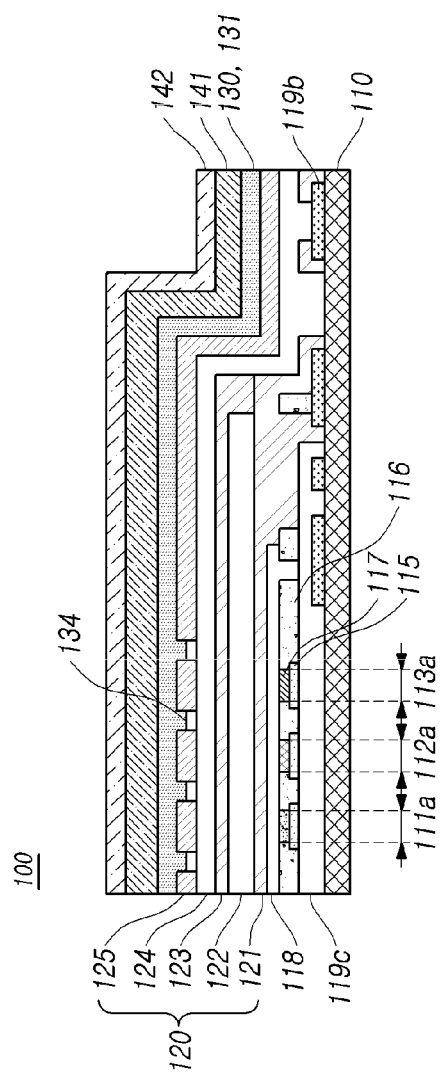
FIGS. 14 to 19 are diagrams for explaining a method of manufacturing a display device according to embodiments of the present disclosure.

Particularly, FIG. 14 illustrates a display panel 100 at a specific stage in the manufacturing process of the display panel 100 according to embodiments of the present disclosure. FIG. 14 is a cross-sectional view of a portion of an active area and a portion of a non-active area of the display panel 100.

Referring to FIG. 14, a display panel 100 according to embodiments of the present disclosure can include a substrate 110, a electrode metal 119a positioned on the substrate 110, a planarization layer 119c positioned on the electrode metal 119a, a first electrode 115 positioned on the planarization layer 119c, a organic layer 117 positioned on the first electrode 115, a bank layer 116 positioned on the planarization layer 119c and the first electrode 115, a second electrode 118 positioned on the organic layer 117 and the bank layer 116, an encapsulation layer 120 positioned on the second electrode, a touch electrode 130 positioned on the encapsulation layer 120, and a conical pattern layer 141 and a semi-circular pattern layer 142 positioned on the touch electrode 130.

The display panel 100 can include a pad 119b in the non-active area.

The touch electrode 130, the conical pattern layer 141, and the semi-circular pattern layer 142 shown in FIG. 14 can be formed as the touch electrode and the conical pattern layer and the semi-circular pattern layer of the display panel according to the embodiments of the present disclosure described above by patterning.

In the present specification, for convenience of description, some components in the intermediate stage will be referred to by reference numerals corresponding to the components of the display panel in the final stage while describing the method of manufacturing a display panel according to embodiments of the present disclosure. However, the structure and shape of the corresponding component of the display panel according to the embodiments of the present disclosure is not limited to the structure and shape shown in the drawings for explaining the intermediate step of the manufacturing method.

The electrode metal 119a is for driving a display panel and a display device according to embodiments of the present disclosure, for example, can be an electrode to which a driving voltage EVDD, a base voltage EVSS, or a reference voltage Vref is applied.

The encapsulation layer 120 can include a second insulating layer 121, a third insulating layer 122, a fourth insulating layer 123, a fifth insulating layer 124, and a sixth insulating layer 125.

The display panel 100 can include a bridge 134 positioned on the fifth insulating layer 124. The bridge 134 can be in contact with the touch electrode 130.

The touch electrode 130 can include a first metal layer 131, and the first metal layer 131 can include titanium (Ti).

As shown in FIG. 14, the touch electrode 130, the conical pattern layer 141, and the semi-circular pattern layer 142 can be sequentially formed over the entire area of the display panel 100.

The conical pattern layer 141 can be made of silicon dioxide (SiO2), and the semi-circular pattern layer 142 can be made of indium tin oxide (ITO).

Figure 15:
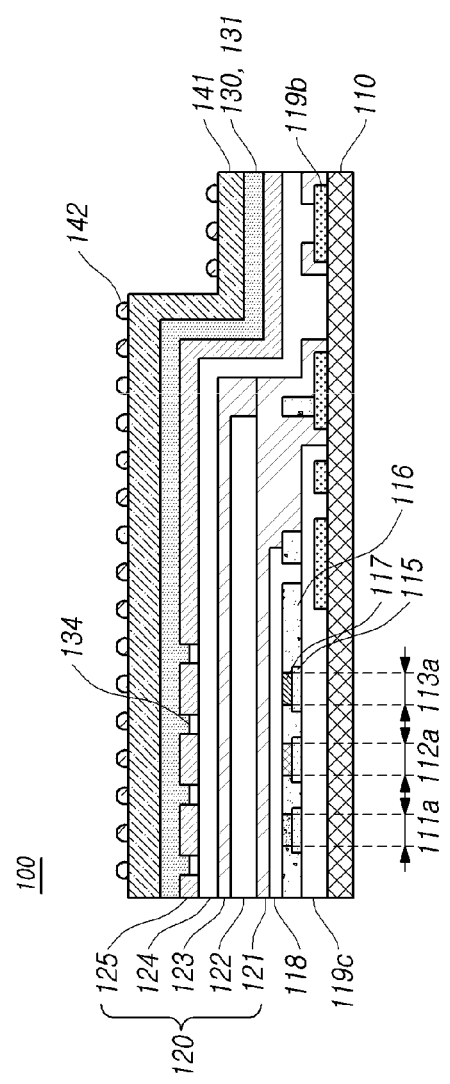

FIG. 15 illustrates a case in which an etching process of the semi-circular pattern layer 142 is performed in the display panel 100 of FIG. 14. Referring to FIG. 15, if the semi-circular pattern layer 142 and the conical pattern layer 141 are made of different materials, only the semi-circular pattern layer 142 can be selectively etched. For example, in the case that the conical pattern layer 141 is silicon dioxide (SiO2) and the semi-circular pattern layer 142 is indium tin oxide (ITO), the semi-circular pattern layer 142 can be wet-etched under acidic conditions, so that the display panel 100 shown in FIG. 15 can be manufactured.

In addition, as shown in FIG. 15, the etching process for the semi-circular pattern layer 142 can proceed to such an extent that a portion of the semi-circular pattern layer 142 remains.

Figure 16:
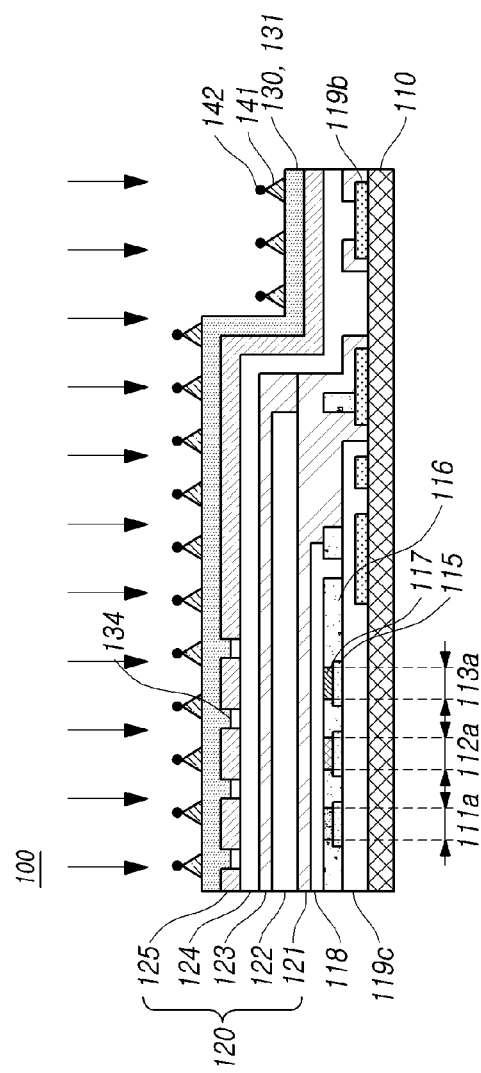

FIG. 16 illustrates a case in which an etching process of the conical pattern layer 141 is performed on the display panel shown in FIG. 15. For example, in the case that the conical pattern layer 141 is made of silicon dioxide (SiO2) and the semi-circular pattern layer 142 is made of indium tin oxide (ITO), when dry etching is performed on the conical pattern layer 141, since the remaining semi-circular pattern layer 142 can prevent the conical pattern layer 141 positioned thereunder from being etched, the display panel 100 shown in FIG. 16 can be manufactured.

In addition, by the remaining semi-circular pattern layer 142 shown in FIG. 16, the conical pattern layer 141 positioned under the semi-circular pattern layer 142 can have a shape in which an upper part of a cone is cut.

Figure 17:
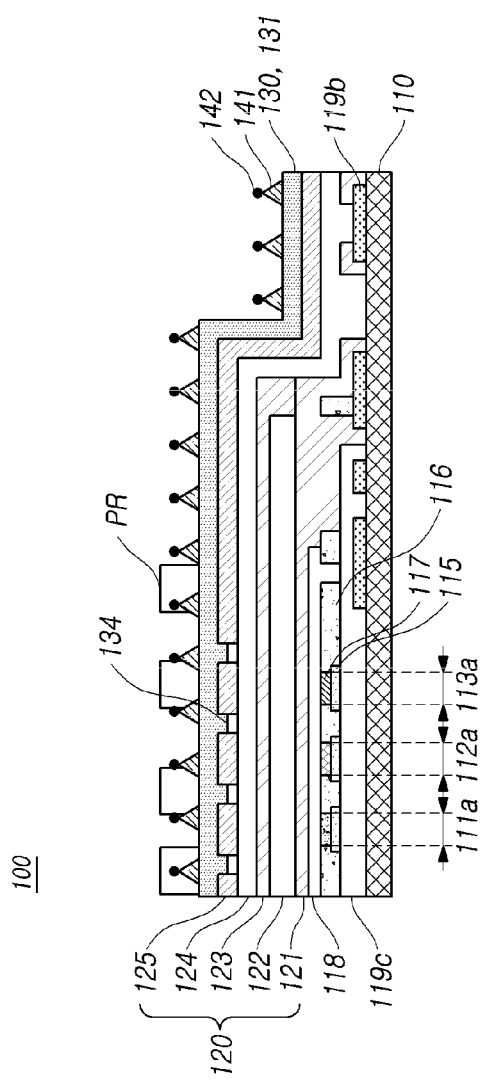

FIG. 17 illustrates a case in which photoresist patterning is performed on the display panel shown in FIG. 16. The photoresist PR can be formed by patterning to overlap the non-light emitting region 114.

Figure 18:
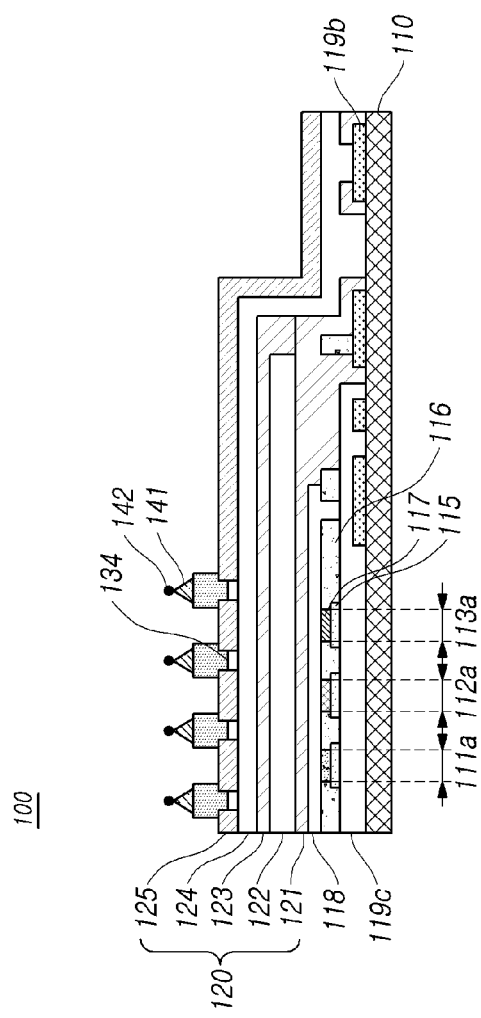

FIG. 18 illustrates a case in which the touch electrode 130 is etched in the display panel shown in FIG. 17. Since the region excluding the portion protected by the photoresist PR is etched, the touch electrode 130 can include the holes OA or the open areas corresponding to the light emitting regions 111a, 112a and 113a of the subpixels 111, 112 and 113.

Figure 19:
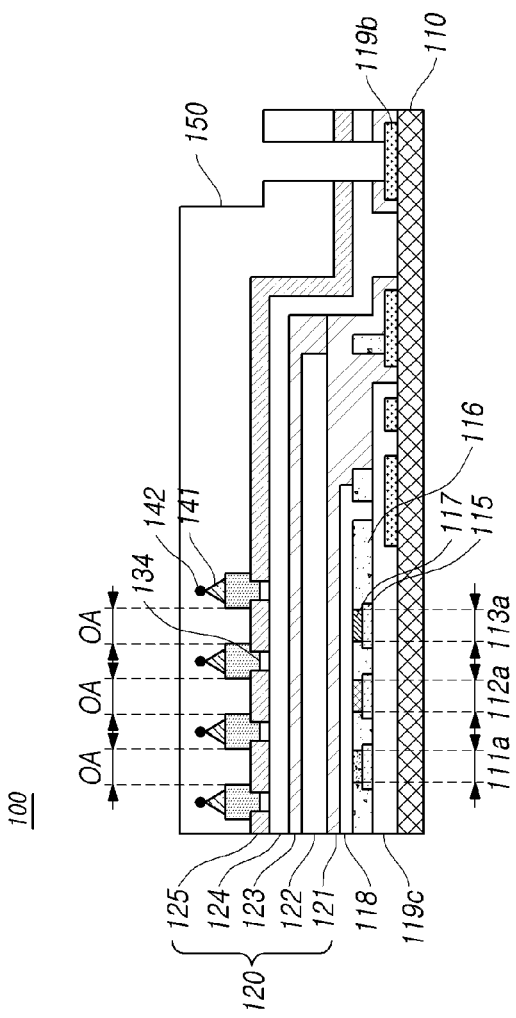

FIG. 19 illustrates a step of forming a contact hole in the pad 119b after forming the first insulating layer 150 on the touch electrode 130 and the nanostructure 140 in the display panel shown in FIG. 18. As shown in FIGS. 14 to 19, in the display panel 100 according to embodiments of the present disclosure, the nanostructure 140 can be easily formed.

Figure 20:
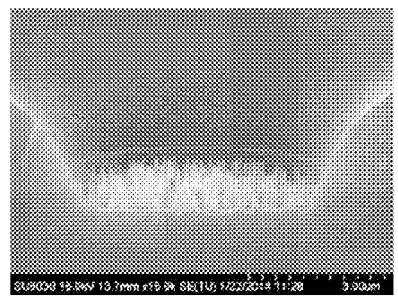
FIGS. 20 and 21 are micrographs of nanostructures according to embodiments of the present disclosure.
Figure 21:
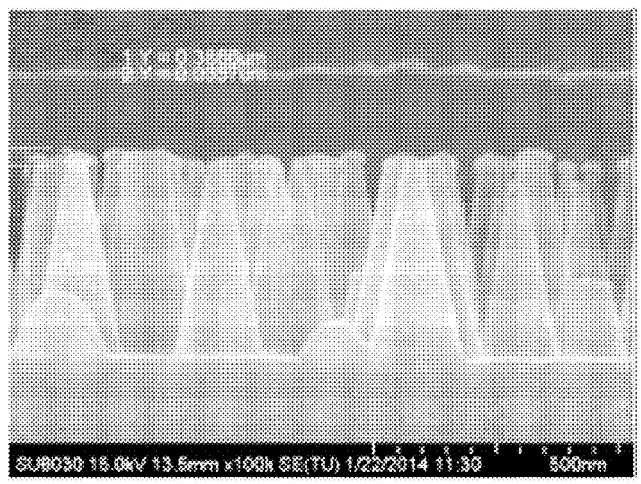

FIGS. 20 and 21 are micrographs of the nanostructures formed through FIGS. 14 to 19. Referring to FIGS. 20 and 21, there can be seen that the nanostructure has a structure including a conical pattern layer and a semi-circular pattern layer.

FIGS. 22 to 27 are diagrams for explaining a method of manufacturing a display panel according to embodiments of the present disclosure.

Figure 22:
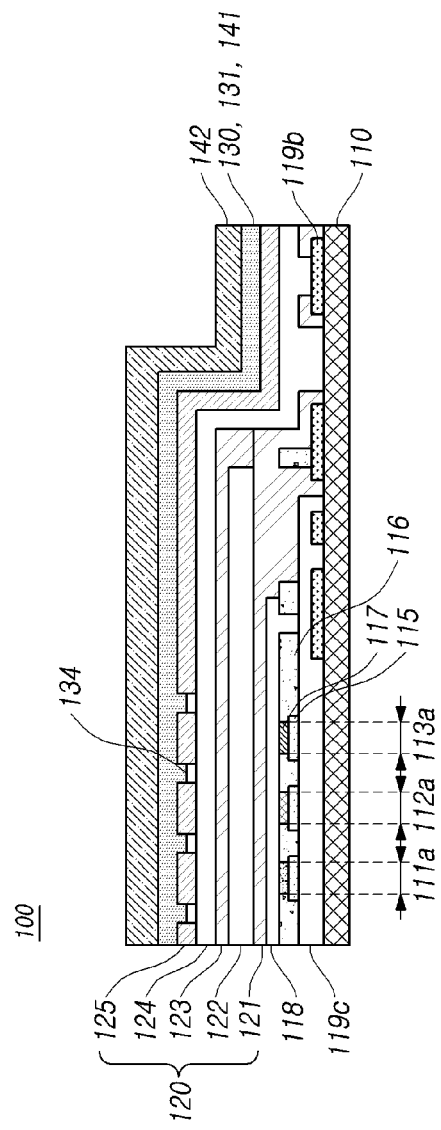
FIGS. 22 to 30 are diagrams for explaining a method of manufacturing a display device according to embodiments of the present disclosure.

Referring to FIG. 22, a display panel 100 according to embodiments of the present disclosure can include a substrate 110, an electrode metal 119a positioned on the substrate 110, a planarization layer 119c positioned on the electrode metal 119a, a first electrode 115 positioned on the planarization layer 119c, an organic layer 117 positioned on the first electrode 115, a bank layer 116 positioned on the planarization layer 119c and the first electrode 115, a second electrode 118 positioned on the organic layer 117 and the bank layer 116, an encapsulation layer 120 positioned on the second electrode, a touch electrode 130 and conical pattern layers 141 positioned on the encapsulation layer 120, and a semi-circular pattern layer 142 positioned on the touch electrode 130.

A first metal layer 131 and the conical pattern layer 141 can be formed from one layer 130, 131, and 141 of FIG. 22 by a manufacturing process to be described later. One layer 130, 131 or 141 can include, for example, titanium (Ti).

Figure 23:
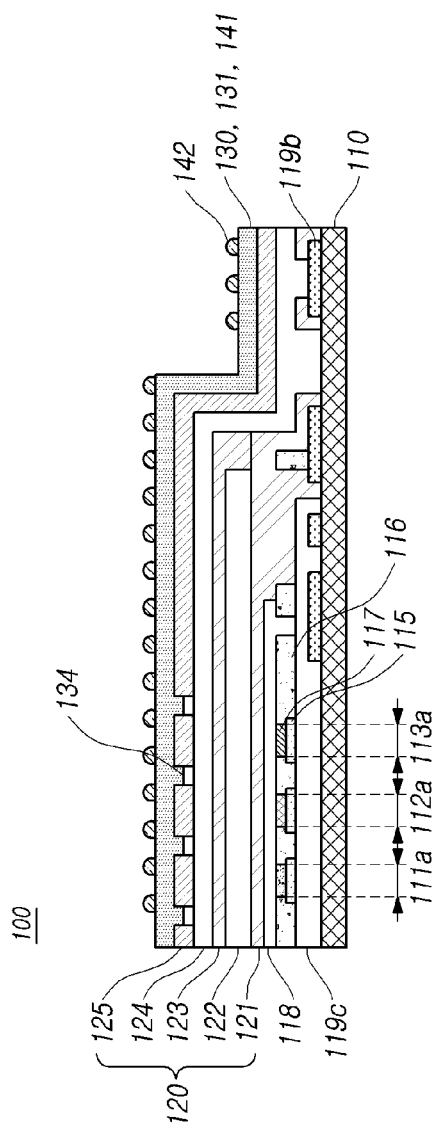

FIG. 23 illustrates a case in which an etching process of the semi-circular pattern layer 142 is performed in the display panel 100 of FIG. 22. Referring to FIG. 23, in the case that the semi-circular pattern layer 142 and the conical pattern layer 141 are made of different materials, only the semi-circular pattern layer 142 can be selectively etched. For example, if the first metal layer 131 and the conical pattern layer 141 are made of titanium (Ti) and the semi-circular pattern layer 142 is made of indium tin oxide (ITO), the semi-circular pattern layer 142 can be wet-etched under an acidic condition to manufacture the display panel 100 shown in FIG. 23.

In addition, as shown in FIG. 23, the etching process of the semi-circular pattern layer 142 can be performed to such a extent that a portion of the semi-circular pattern layer 142 is left.

Figure 24:
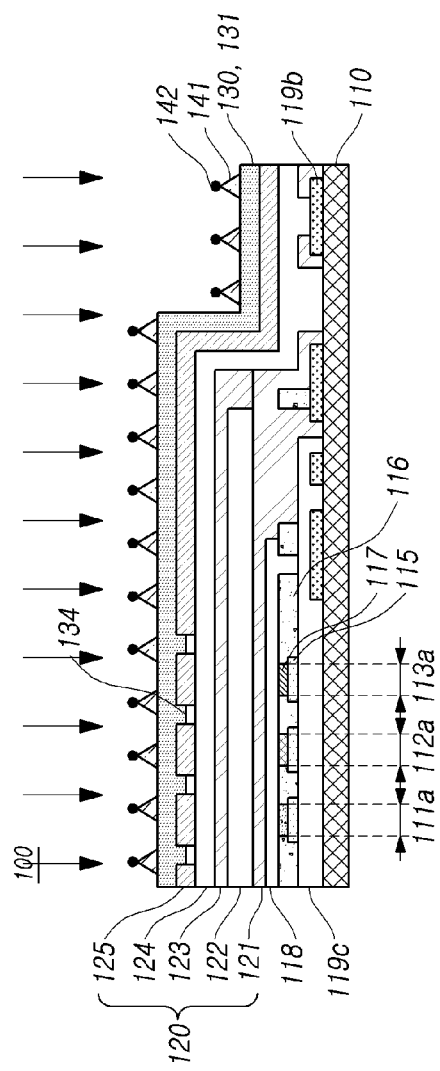

FIG. 24 illustrates a case in which an etching process of the conical pattern layer 141 is performed on the display panel shown in FIG. 23. For example, in the case that the conical pattern layer 141 is made of titanium (Ti) and the semi-circular pattern layer 142 is made of indium tin oxide (ITO), when a dry etching is performed on the conical pattern layer 141, the remaining semi-circular pattern layer 142 can prevent the conical pattern layer 141 located below from being etched, so the display panel 100 shown in FIG. 24 can be manufactured.

In addition, by the remaining semi-circular pattern layer 142 shown in FIG. 24, the conical pattern layer 141 located under the semi-circular pattern layer 142 can have a shape in which an upper part of a cone is cut.

Figure 25:
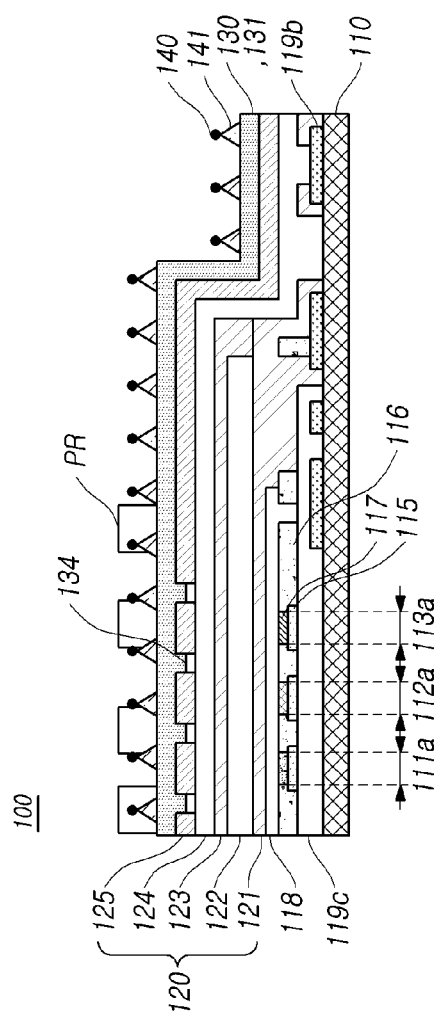

FIG. 25 illustrates a case in which photoresist patterning is performed in the display panel shown in FIG. 24. The photoresist PR can be formed by patterning to overlap the non-light emitting region 114.

Figure 26:
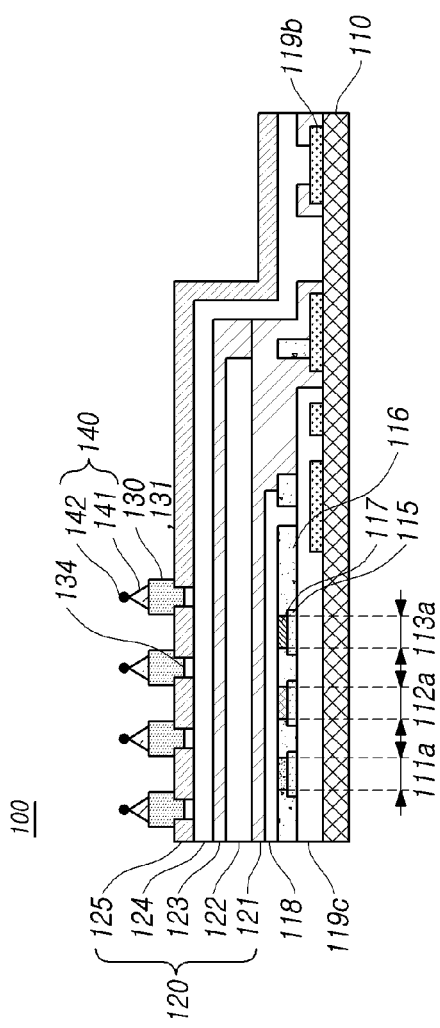

FIG. 26 illustrates a state in which the touch electrode 130 is etched in the display panel shown in FIG. 25. Since the region excluding the portion protected by the photoresist PR is etched, the touch electrode 130 can include the holes OA or the open areas corresponding to the light emitting regions 111a, 112a, and 113a of the subpixels 111, 112 and 113.

Figure 27:
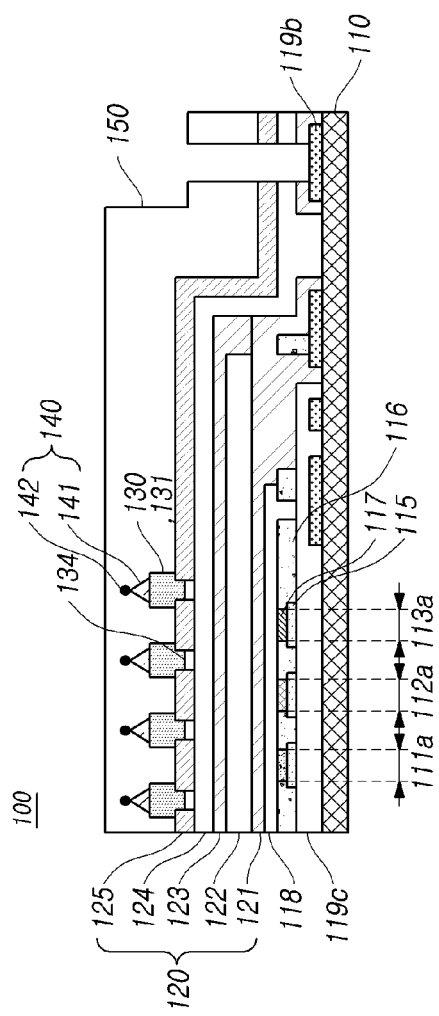

FIG. 27 illustrated a state in which a contact hole is formed in the pad 119b after the first insulating layer 150 is formed on the touch electrode 130 and the nanostructure 140 in the display panel shown in FIG. 26. As shown in FIGS. 22 to 27, in the display panel 100 according to embodiments of the present disclosure, the nanostructure 140 can be easily formed.

FIGS. 28 to 33 are diagrams for explaining a method of manufacturing a display panel according to embodiments of the present disclosure.

Figure 28:
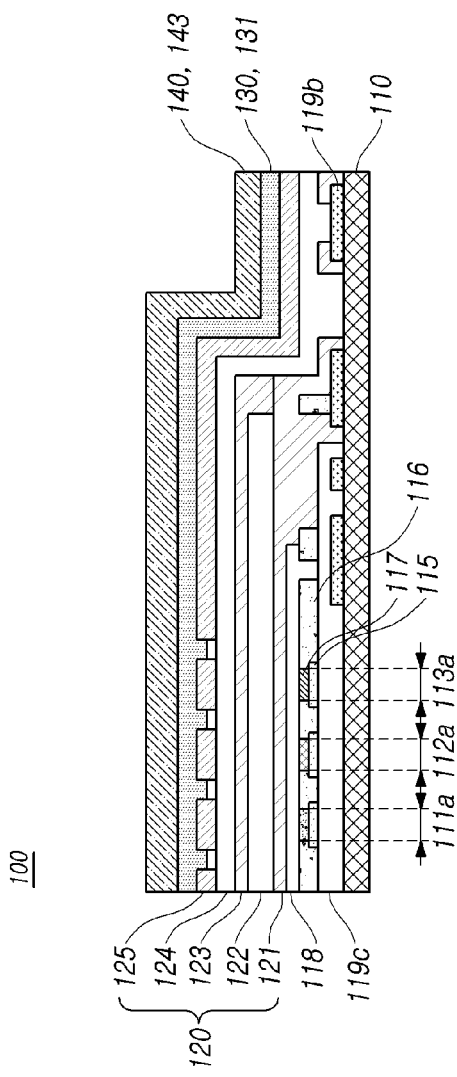

Referring to FIG. 28, a display panel 100 according to embodiments of the present invention can include a substrate 110, an electrode metal 119a positioned on the substrate 110, a planarization layer 119c positioned on the electrode metal 119a, a first electrode 115 positioned on the planarization layer 119c, an organic layer 117 positioned on the first electrode 115, a bank layer 116 positioned on the planarization layer 119c and the first electrode 115, a second electrode 118 positioned on the organic layer 117 and the bank layer 116, an encapsulation layer 120 positioned on the second electrode, a touch electrode 130 positioned on the encapsulation layer 120, and a nanostructure 140 positioned on the touch electrode 130.

The touch electrode 130 can include a first metal layer 131, and the first metal layer 131 can include titanium (Ti).

The nanostructure 140 can include silicon dioxide (SiO2). Since the nanostructure 140 is formed after a circuit element such as an organic light emitting diode (OLED) is formed thereunder, the nanostructure 140 can be formed in a low temperature process, and for example, can include silicon dioxide (SiO2) formed in a low temperature process.

Figure 29:
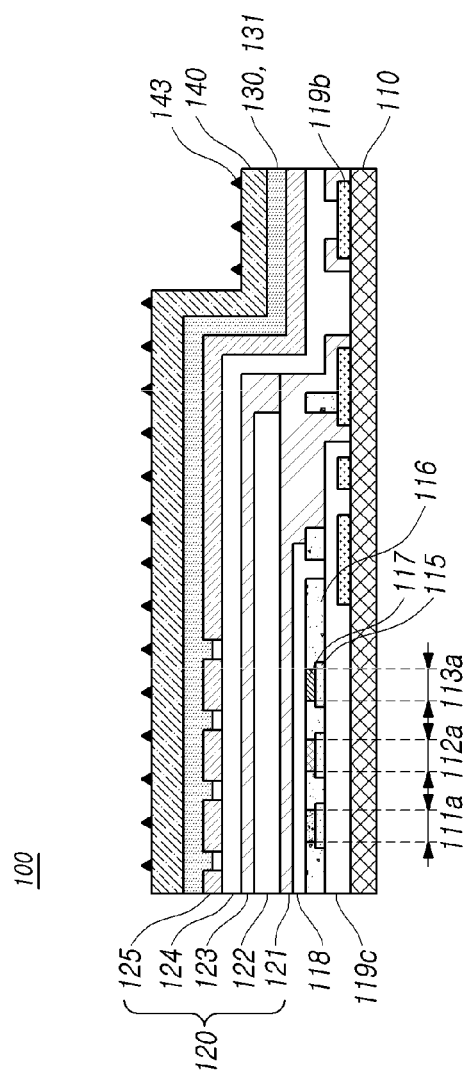

FIG. 29 illustrates a state in which the etching process of the nanostructure 140 is performed on the display panel shown in FIG. 28. For example, in the case that the nanostructure 140 is made of silicon dioxide (SiO2) formed in the low temperature process, when wet etching is performed, there can be formed a plurality of irregularities on the surface due to the characteristics of silicon dioxide (SiO2) formed at a low temperature.

Figure 30:
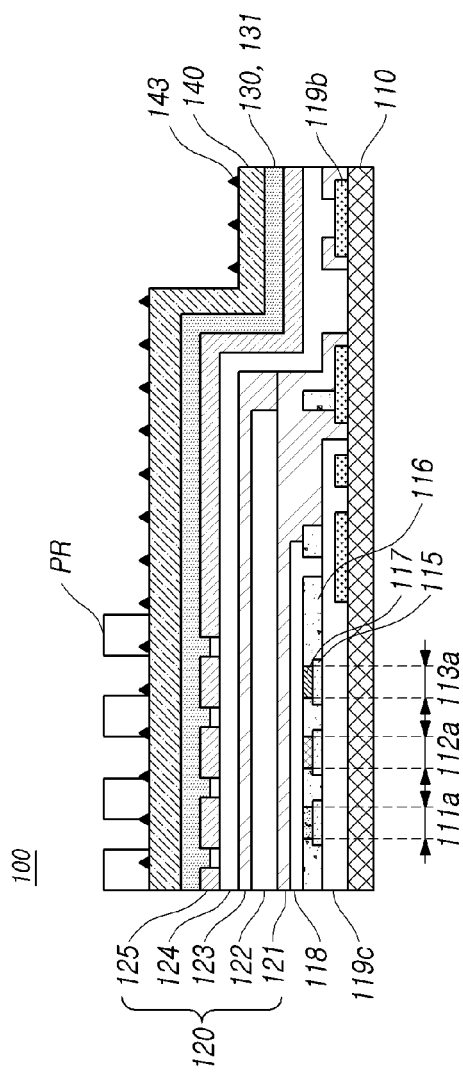

FIG. 30 illustrates a state in which photoresist patterning is performed in the display panel shown in FIG. 29. The photoresist PR can be formed by patterning to overlap the non-light emitting region 114.

Figure 31:
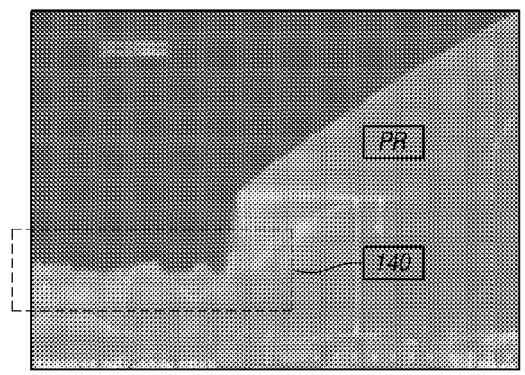
FIG. 31 is a micrograph of a nanostructure according to embodiments of the present disclosure.

FIG. 31 is a micrograph of the nanostructure 140 formed by the manufacturing method up to FIG. 30. Referring to FIG. 31, the nanostructure 140 can include a plurality of irregularities which are irregularly formed.

Figure 32:
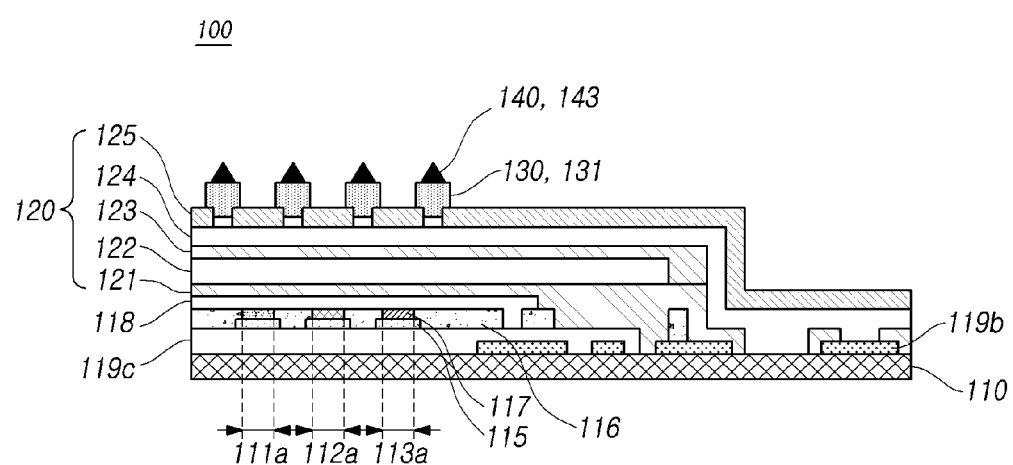
FIGS. 32 to 34 are diagrams for explaining a method of manufacturing a display device according to embodiments of the present disclosure.

FIG. 32 illustrates a case in which the nanostructure 140 and the touch electrode 130 are etched in the display panel shown in FIG. 30. Since the region excluding the portion protected by the photoresist PR is etched, the touch electrode 130 can be formed to include the holes OA or the open areas corresponding to the light emitting regions 111a, 112a and 113a of the subpixels 111, 112 and 113.

Figure 33:
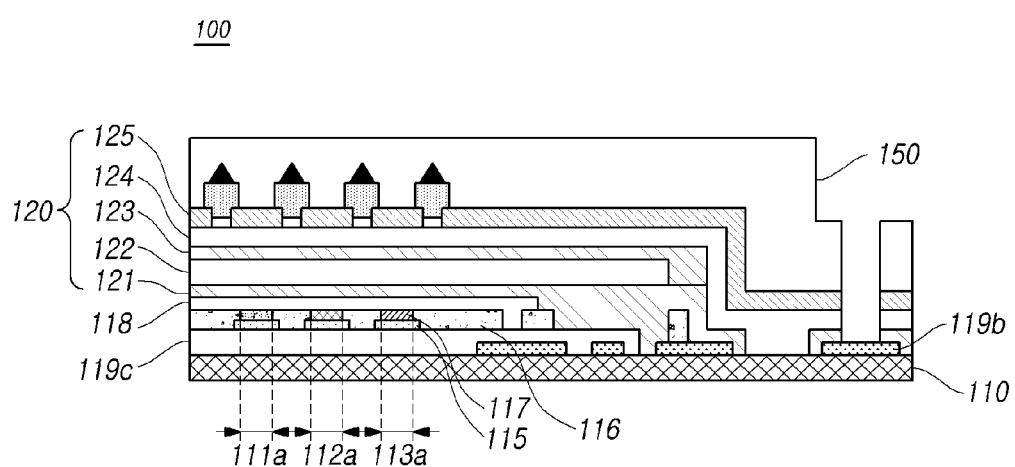

FIG. 33 illustrates a state in which a contact hole is formed in the pad 119b after the first insulating layer 150 is formed on the touch electrode 130 and the nanostructure 140 in the display panel shown in FIG. 32. As shown in FIGS. 28 to 33, in the display panel 100 according to embodiments of the present disclosure, the nanostructure 140 including a plurality of irregularly formed irregularities can be easily formed.

Figure 34:
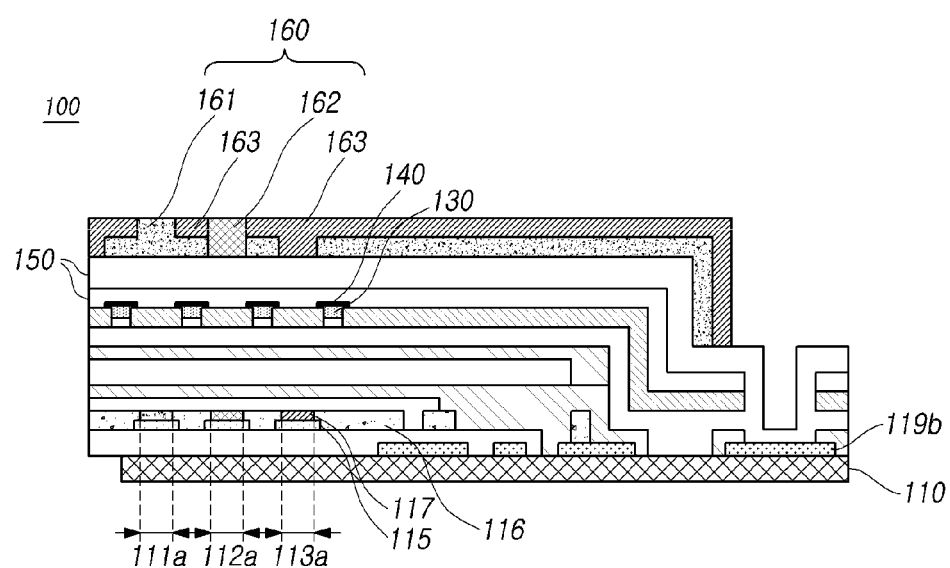

FIG. 34 illustrates a display panel in which the color filter 160 is formed after forming the first insulating layer 150.

Referring to FIG. 34, after forming the first insulating layer 150, the color filter 160 including a first conversion portion 161, a second conversion portion 162, and a third conversion portion 163 can be formed on the first insulating layer 150.

In the non-light emitting region 114, the first conversion portion 161 and the third conversion portion 163 of the color filter can be positioned to overlap each other.

In this example, the first color can be red, the second color can be green, and the third color can be blue.

In another aspect, embodiments of the present disclosure can provide a display device including a display panel and a control unit for driving the display panel.

In the display device according to the embodiments of the present disclosure, the display panel is the same as that described for the display panel according to the embodiments of the present disclosure, and thus it will be omitted the duplicate description or may be briefly provided.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention.

The above description and the accompanying drawings provide an example of the technical idea of the present invention for illustrative purposes only. For example, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A display panel comprising:
   a substrate in which a first subpixel including a first light emitting region configured to emit light having a first color, a second subpixel including a second light emitting region configured to emit light having a second color and a third subpixel including a third light emitting region configured to emit light having a third color are defined, the substrate including a non-light emitting region positioned around the first light emitting region, the second light emitting region and the third light emitting region;
   an encapsulation layer disposed on the substrate;
   a touch electrode disposed on the encapsulation layer and including a first metal layer;
   a nanostructure disposed on the touch electrode, and being in direct contact with the first metal layer;
   a first insulating layer disposed on the nanostructure; and
   a color filter including a first conversion portion disposed on the first insulating layer, a second conversion portion disposed on the first insulating layer, and a third conversion portion disposed on the first insulating layer, the first, second and third conversion portions corresponding respectively to the first, second and third sub-pixels,
   wherein in the non-light emitting region, the nanostructure, the first conversion portion and the third conversion portion are positioned to overlap each other.

2. The display panel of claim 1, wherein the touch electrode further comprises a second metal layer including a different metal from the first metal layer, and the first metal layer is disposed on the second metal layer.

3. The display panel of claim 2, wherein the touch electrode further comprises a third metal layer including a different metal from the first metal layer, and the second metal layer is disposed on the third metal layer.

4. The display panel of claim 3, wherein the first metal layer and the third metal layer comprise the same metal.

5. The display panel of claim 1, wherein the nanostructure comprises:
   a conical pattern layer in direct contact with the first metal layer; and
   a semi-circular pattern layer disposed on the conical pattern layer.

6. The display panel of claim 5, wherein the semi-circular pattern layer is made of a material different from a material of the conical pattern layer.

7. The display panel of claim 5, wherein the conical pattern layer is made of a material different from a material of the first metal layer.

8. The display panel of claim 5, wherein the conical pattern layer is an inorganic insulator.

9. The display panel of claim 5, wherein the conical pattern layer is composed of an inorganic insulator,
   the semi-circular pattern layer is composed of a metal oxide, and
   the semi-circular pattern layer is in direct contact with the conical pattern layer.

10. The display panel of claim 5, wherein the first metal layer and the conical pattern layer are made of the same material as each other, and
    the semi-circular pattern layer is in direct contact with the conical pattern layer.

11. The display panel of claim 1, wherein the nanostructure comprises a plurality of irregularities irregularly formed.

12. The display panel of claim 11, wherein the plurality of irregularities irregularly formed are inorganic insulators.

13. A display device comprising:
    a display panel; and
    a controller configured to control the display panel,
    wherein the display panel comprises:
    a substrate in which a first subpixel including a first light emitting region configured to emit light having a first color, a second subpixel including a second light emitting region configured to emit light having a second color and a third subpixel including a third light emitting region configured to emit light having a third color are defined, the substrate including a non-light emitting region positioned around the first light emitting region, the second light emitting region and the third light emitting region;
    an encapsulation layer disposed on the substrate;
    a touch electrode disposed on the encapsulation layer and including a first metal layer;
    a nanostructure disposed on the touch electrode, and in direct contact with the first metal layer;
    a first insulating layer disposed on the nanostructure; and
    a color filter including a first conversion portion disposed on the first insulating layer, a second conversion portion disposed on the first insulating layer, and a third conversion portion disposed on the first insulating layer, the first, second and third conversion portions corresponding respectively to the first, second and third sub-pixels,
    wherein in the non-light emitting region, the nanostructure, the first conversion portion and the third conversion portion are positioned to overlap each other.

* * * * *